United States Patent
Biegelsen et al.

[11] Patent Number: 5,953,061
[45] Date of Patent: Sep. 14, 1999

[54] PIXEL CELLS HAVING INTEGRATED ANALOG MEMORIES AND ARRAYS THEREOF

[75] Inventors: David K. Biegelsen, Portola Valley; Warren B. Jackson, San Francisco; Robert A. Street, Palo Alto, all of Calif.

[73] Assignee: Xerox Corporation, Stamford, Conn.

[21] Appl. No.: 09/075,149

[22] Filed: May 8, 1998

Related U.S. Application Data

[63] Continuation of application No. 08/368,134, Jan. 3, 1995, Pat. No. 5,808,676.

[51] Int. Cl.⁶ .................................................. H04N 5/335
[52] U.S. Cl. ......................... 348/308; 348/310; 348/315; 257/233
[58] Field of Search ..................... 348/294, 302, 348/306, 307, 308, 309, 310, 311, 315; 257/231, 232, 233

[56] References Cited

U.S. PATENT DOCUMENTS

| | | | |
|---|---|---|---|
| 3,832,700 | 8/1974 | Wu et al. | 340/173.2 |
| 4,267,469 | 5/1981 | Ohba et al. | 307/311 |
| 5,055,930 | 10/1991 | Nagasaki et al. | 358/213.11 |
| 5,196,912 | 3/1993 | Matsumoto et al. | 357/23.7 |
| 5,280,358 | 1/1994 | Yushiya et al. | 358/213.17 |
| 5,327,272 | 7/1994 | Fujiwara et al. | 359/75 |
| 5,355,165 | 10/1994 | Kosonocky et al. | 348/311 |
| 5,808,676 | 9/1998 | Biegelsen et al. | 348/308 |

FOREIGN PATENT DOCUMENTS 621474  1/1994  Japan .

OTHER PUBLICATIONS

P. Arnett, Ferroelectric FET Device, *IBM Technical Disclosure Bulletin*, vol. 15 No. 9, Feb. 1993, p. 2825.

*Primary Examiner*—Wendy Garber
*Assistant Examiner*—Ngoc-Yen Vu

[57] ABSTRACT

Image transduction device pixel cells are described which have analog memory integrated with the pixel transduction elements and arrays made from such pixel cells. The integrated pixel cells are capable of storing information which, for example, can achieve a desired transduction transfer function for a given pixel transduction element. While the present invention may be used with any type of continuously variable, settable, and nonvolatile analog memory, the analog memory is beneficially based on a ferroelectric gate transistor comprised of an amorphous silicon transistor integrated with a ferroelectric gate dielectric layer or an amorphous silicon transistor with a charge storage dielectric gate layer.

18 Claims, 5 Drawing Sheets

PIXEL CELLS HAVING INTEGRATED ANALOG MEMORIES AND ARRAYS THEREOF

This application is a continuation of application Ser. No. 08/368,134, filed Jan. 3, 1995 U.S. Pat. No. 5,808,676.

This invention relates to image transduction devices which have pixel cells. More particularly, this invention relates to pixel cells which contain pixel transduction devices integrated with electrically modifiable, nonvolatile analog memories, and to arrays made from such pixel cells.

BACKGROUND OF THE PRESENT INVENTION

There are many types of image transduction devices which use arrays of individual transduction elements. Those devices include image scanners, cameras, artificial retinas, printers, and displays. Frequently, image transduction devices are designed around pixels. As used herein, a pixel is a fundamental building block of an image in that the image is represented by the composite states of all of its pixels. Since an image has both an optical representation (one that can be sensed, either directly or indirectly, based upon optical signals) and a data representation based upon electronic signals (such as voltage, current, or charge, either in digital or analog form), a pixel can be represented either optically or electronically.

In image transduction devices designed around pixels, each pixel usually corresponds to its own pixel cell which includes an image transduction element. Such transduction elements convert pixel image information between the pixel's optical and data forms. For example, a photodiode creates a certain number of separated electron-hole pairs per absorbed photon, and a liquid crystal-filled capacitor modulates incident light by an amount related to the charge on the capacitor plates. While there are many types of image transduction elements currently available, the more common ones are light emitting diodes, photodiodes, liquid crystal display elements, field emission tips and phosphors, and phototransistors. Some pixel cells may contain other electronics in addition to image transduction elements. For example, an array of liquid crystal display elements may have millions of individual pixel cells, each of which includes both an image transduction element comprised of a liquid crystal light valve and an associated transistor switch that facilitates active matrix addressing. Another example is an image scanner which may include thousands or even millions of individual pixel cells, each of which includes an image transduction element comprised of a light sensitive element, possibly a photodiode, and an associated transistor switch which controls the output of the photodiode.

Most large-area, image transduction arrays operate in real time Due to the large amount of data, optical and/or electronic, which is required to represent many images, and due to the speed required to process that data in a useful fashion, some image transduction devices could benefit by incorporating electronic memory within each pixel cell. Pixel cell based memory could simplify some types of image processing operations. Examples of such operations include pixel calibration, motion detection and compensation, adaptive filtering, and data compression and decompression, to name but a few. Furthermore, pixel cells with memory could reduce the number of expensive interconnecting lines per pixel and could facilitate the interchange of information required by some image processing algorithms.

However, because of deficiencies in the prior art, pixel cells with memory were not used, at least in large area pixel-based image transduction machines. Typically, all special functions were implemented in electronics external to the pixel cell. For example, in image scanners any variations in the gain and the offset of the pixel cell image transduction elements and any non-uniformity in the illumination source were usually corrected using external (non-pixel cell based) electronic circuits after the image is converted to digital form. Typical external electronic correction circuits include lookup tables and digital memory devices. Such external electronic correction circuits add to the cost and complexity of the scanner and create significant interface problems since the processing usually must occur in series rather than in parallel.

To compete with prior art image processing techniques, pixel cells with internal or integrated memory should fulfill a number of requirements. First, the memory should be compact enough to allow most of the pixel cell area to be dedicated to the pixel cell image transduction element. Second, power consumption should be low. Third, the memory should be nonvolatile so that the pixel memory information need not be continually refreshed, nor erased if power is removed. Fourth, the memory should have a well-defined memory state (a given input into the memory should result in a reliably known output from the memory.) Fifth, the state of the memory should affect the image transfer function of the pixel cell. The pixel cell image transfer function is defined to be the relationship between pixel cell inputs and outputs, whether those inputs and outputs are optical or electronic data.

Because analog memories can, in principle, meet the above requirements it would be highly desirable to integrate them into pixel cells that are used in large area image transduction devices. However, pixel cell analog memories have not been used in the prior art, at least partially because of problems with element-to-element variations in analog element fabrication and because of memory volatility. Therefore, pixel cells having integrated, nonvolatile analog memories coupled with methods that circumvent their problems would be useful.

SUMMARY OF THE INVENTION

It is an object of the present invention to integrate pixel image transduction elements and analog memory elements into pixel cells.

It is another object of the present invention to implement simple, pixel cell integrated analog memory elements which are settable using loop feedback.

It is another object of the present invention to provide for settable, nonvolatile, analog memory capabilities integrated into pixel cells in image transduction arrays.

It is yet another object of the present invention to provide for means by which the state of a memory affects the image transduction process.

According to the principles of the present invention, nonvolatile analog memory elements are integrated with pixel image transduction elements and controllers into integrated pixel cells. Such integrated pixel cells have the capability of storing information which can be used to control the relationship between an optical representation of a pixel and a data representation in electronic form of that pixel. Beneficially, the stored information is applied to a controller which adjusts the pixel cell transduction transfer function between the optical representation and the data representation. Then, when an input signal, either optical or electrical, is provided to elicit the desired pixel cell response, the stored information sets the transfer function of the pixel. Beneficially, the stored information can be determined using feedback.

While the present invention may be used with other types of continuously variable, settable, and nonvolatile analog memory elements, (such as filamentary voltage settable resistance devices, floating gate devices, and various devices based upon controlled charge transfer between a FET channel and a gate dielectric), an analog memory element based on an integrated transistor comprised of a transistor and either a ferroelectric layer or a charge storing dielectric layer is preferred.

BRIEF DESCRIPTION OF THE DRAWINGS

Other aspects of the present invention will become apparent as the following description proceeds and upon reference to the drawings, in which.

Figure 1:
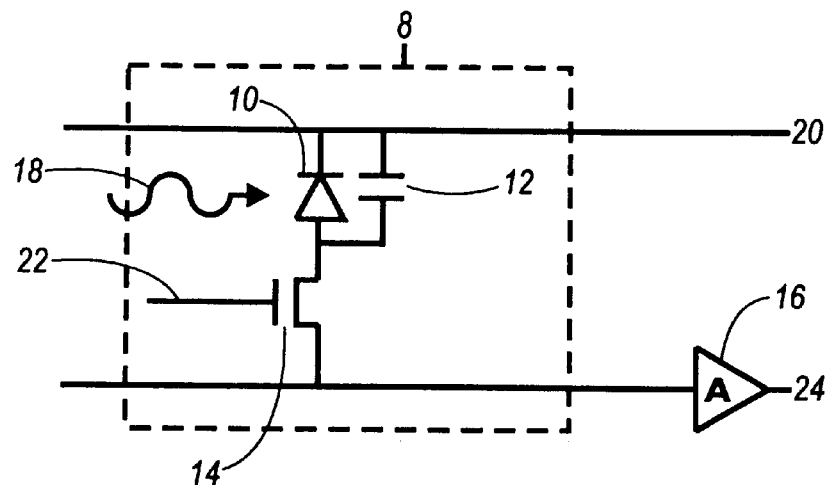
FIG. 1 schematically illustrates a typical prior art pixel cell.

Note that in the drawings that like numbers designate like elements. Additionally, the subsequent text includes directional signals which are taken relative to the drawings (such as right, left, top, and bottom, lower). Those directional signals are meant to aid the understanding of the present invention, not to limit it.

DETAILED DESCRIPTION OF THE PREFERRED EMBODIMENTS

Prior Art Cells

FIG. 1 shows a simplified schematic depiction of a typical prior art pixel cell 8 of the type frequently used in image scanners. That cell has an image transduction element represented by a photodiode 10 and a capacitor 12, and supporting electronics comprised of a pass transistor 14 and an amplifier 16. In operation, external illumination 18 induces in photodiode 10 electron hole pairs which are separated by a reverse-bias field applied on voltage line 20. The capacitance of the photodiode, which is illustrated by the capacitor 12, is charged to a charge Q(I); that charge is linearly proportional to the illumination 18. Periodically, external circuity (not shown) applies a gate select signal on a line 22. That signal causes the transistor 14 to pass the charge built up on the capacitor 12 to the amplifier 16. That amplifier reads its applied charge or its applied voltage and then outputs current on a line 24. That charge is dependent upon the illumination 18 and on the length of time that the gate select signal is activated.

When cells 8 are used in an array, the individual cells are beneficially accessed sequentially by active matrix multiplexing. In active matrix multiplexing at least two switchable lines are required to uniquely select a given pixel cell. This is conveniently performed using the line 22 and multiplexed inputs to an amplifier 16 which is shared by a plurality of individual cells.

Significant problems exist with the prior art pixel cells 8. If many cells 8 are fabricated, even on the same substrate, the response of the individual cells are different. Furthermore, the illumination 18 can vary from cell to cell. Thus, with the same nominal illumination 18 individual cells will output different currents on the line 24. While variations in pixel cell responses could be compensated by varying the characteristics of the cell components, once fabricated the characteristics of those components are rather difficult to alter.

An Architecture for Pixel Cells with Analog Memory

Figure 2:
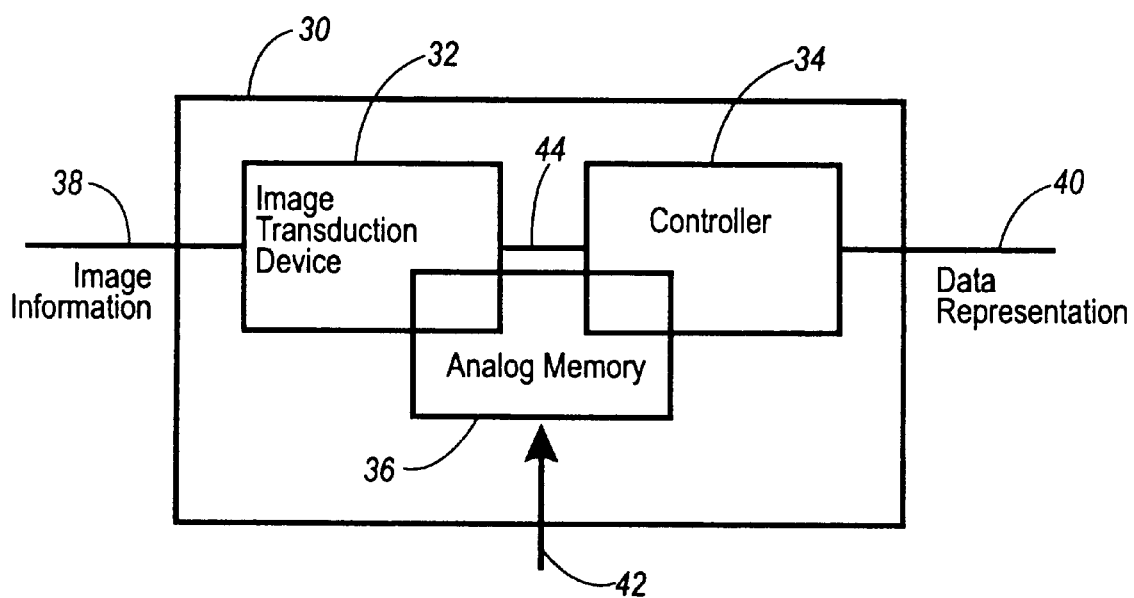
FIG. 2 illustrates an architecture for pixel cells with integrated analog memory.

An inventive solution to some of the problems with the prior art pixel cells 8, and with prior art pixel cells in general, is to integrate analog memory elements into pixel cells. A beneficial architecture for that integration is shown in FIG. 2. FIG. 2 shows a block diagram of a pixel cell 30 comprised of an image transduction element 32, a controller 34, and an analog memory element 36. The image transduction element 32 connects to an external image information path 38, the controller 34 connects to an external data information line 40, and the analog memory element 36 connects to an external memory information line 42. The image information path 38 is an optical link between image information in the external environment and the image transduction element. The data information line 40 and the memory information line 42 are electrical links between the remainder of the image transduction device and the pixel cell. Additionally, the pixel cell 30 has an internal electronic information line 44 which interconnects the image transduction element 32 and the controller 34. It should be noted that while the image transduction element, the controller, and the analog memory element are described as discrete blocks, they need not be discrete elements.

It is to be understood that the pixel cell 30 can either receive image information and output data information (as in a scanner) or it can output image information and receive data information (as in a display). However, to understand the basic operation of the pixel cell 30, assume that the pixel cell 30 is converting image information into a data representation (the use of the pixel cell to convert data information into image information is directly analogous). Image information is applied to the image transduction element 32 via the image information path 38. The image transduction element converts the image information into an electronic representation on the electronic information line 44. The electronic representation and memory information stored in the analog memory element 36 are applied to the controller 34. The controller uses the memory information to adjust its transfer function, and converts the electronic representation into a data representation according to its adjusted transfer function. If the transfer function is not correct, new memory information is applied to the analog memory element on the memory information line 42 so that the data representation is correct.

An Inventive First Embodiment Pixel Cell

Figure 3:
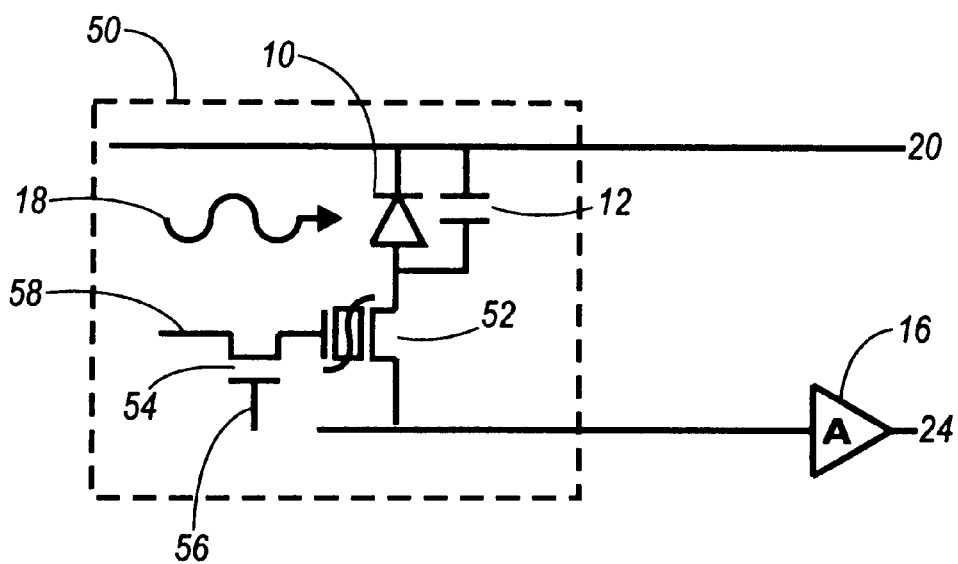
FIG. 3 schematically illustrates a first embodiment pixel cell according to the principles of the present invention.

While FIG. 2 shows a beneficial architecture for a pixel cell 30 in block diagram form, FIG. 3 shows a structural embodiment of a pixel cell 50 which is in accord with the principles of the present invention. The pixel cell 50 includes an adjustable threshold transistor 52 (described in more detail below) which acts jointly as a pass transistor (a pixel output switch) and as a nonvolatile analog memory element. By comparing pixel cells 8 and 50 (FIGS. 1 and 3) it can be seen that one of the differences between the pixel cells 8 and 50 is that in the pixel cell 50 the adjustable threshold transistor 52 replaces the transistor 14 of pixel cell 8. Another difference between the pixel cells is that the pixel cell 50 includes a transistor 54 which has a gate that connects to a line 56 and a source which connects to a line 58. The purpose of the transistor 54 and the lines 56 and 58 are subsequently discussed.

To fully understand the operation of the pixel cell 50 it may first be required to understand the adjustable threshold transistor 52.

An Adjustable Threshold Transistor

Figure 4:
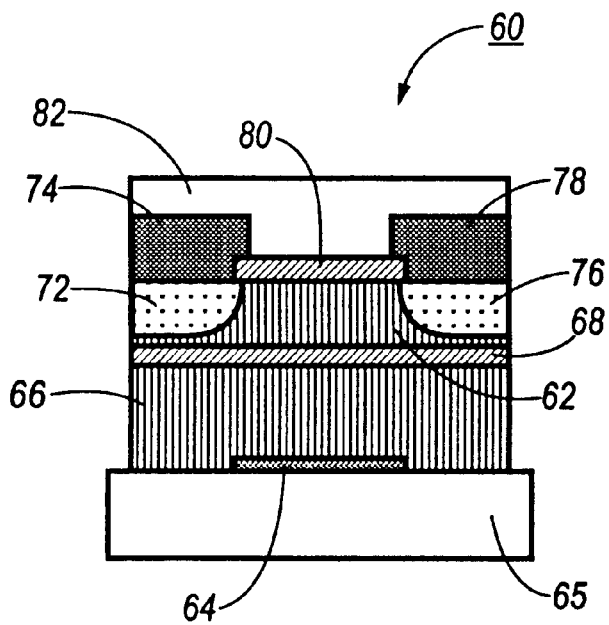
FIG. 4 shows a cross sectional view of an embodiment of an adjustable threshold transistor, one which uses a ferroelectric layer.

While the adjustable threshold transistor 52 has a number of different embodiments, a beneficial one is the amorphous silicon ferroelectric transistor 60 shown in FIG. 4. The ferroelectric transistor 60 is beneficially in accord with the principles of The ferroelectric transistor 60 has an amorphous silicon active region 62. Construction of the ferroelectric transistor 60 begins with a bottom gate electrode 64 on a substrate 65. Over that electrode is a ferroelectric layer 66 which is comprised of a ferroelectric material, beneficially a 1000 Å to 2000 Å thick layer of PZT (lead zirconate-titanate) or potassium nitrate. Over the ferroelectric layer is an isolation layer 68. With an amorphous silicon active region the preferred isolation layer is a thin layer (around 50 Å) of silicon nitride ($Si_3N_4$). The amorphous silicon active region 62 is then deposited on the isolation layer using any of the well known low temperature deposition techniques such as plasma enhanced chemical vapor deposition. Good results are obtained using undoped amorphous silicon.

With the amorphous silicon active region in place, source and drain contacts are fabricated on that active region using a self-aligned masking process. The source contact, comprised of a heavily doped region 72 and a metallic contact 74, is located at one end of the amorphous silicon active region 62. At the other end of that region is a drain contact comprised of a heavily doped region 76 and a metallic contact 78. A non-ferroelectric dielectric layer 80 is over the active region between the source and drain contacts. Source and drain lead wires (not shown) are connected to the metallic contacts and a passivation layer 82 is placed over the dielectric layer 80 and over the source and drain contacts.

Operation of the First Embodiment Pixel Cell

The operation of the pixel cell 50 is explained with the assumption that the adjustable threshold transistor 52 is actually a ferroelectric transistor 60 (shown in detail in FIG. 4). In the following reference should be made to FIGS. 3 and 4 as required. The adjustable threshold transistor 60 has the characteristic that relatively high gate voltage pulses (say between 10 and 20 volts magnitude and 1–10 microsecond in duration) applied between the gate electrode 64 and the metallic contacts 74 and 78 cause the polarization of the ferroelectric layer 66 to change in either a first direction (positive voltage pulses) or the opposite direction (negative voltage pulses). The amount of polarization is dependent upon many factors, including the ferroelectric material used, the thickness of the ferroelectric material and the isolation layer, the number of pulses, the magnitude of the pulses, the length of the pulses, and the previous state of polarization. Importantly, the polarization of the ferroelectric layer affects the current flow through the adjustable threshold transistor 52 for a given gate voltage.

Figure 5:
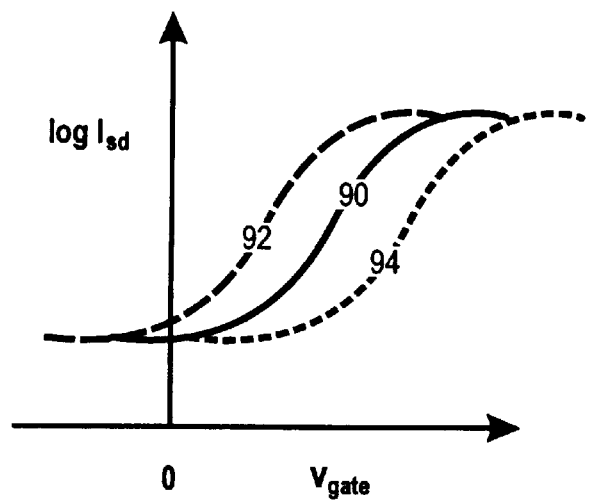
FIG. 5 shows a graph of the source-drain current versus gate voltage characteristics of the adjustable threshold transistor in FIG. 3, when that transistor is in accordance with FIG. 4.

The effect of the polarization of the ferroelectric layer on the current flow through the adjustable threshold transistor, 52 in FIG. 3, for a given gate voltage is explained with reference to FIG. 5. If high voltage pulses had not been applied to its gate, the adjustable threshold transistor 52 has log $I_{sd}$ versus $V_{gate}$ characteristics which follow the curve 90. However, if a multiplicity of high negative voltage pulses have been applied to its gate, the adjustable threshold transistor 52 can be made to follow the log $I_{sd}$ verses $V_{gate}$ characteristics of curve 94. Likewise, if a multiplicity of high positive voltage pulses had been applied to its gate, the adjustable threshold transistor 52 can be made to follow the log $I_{sd}$ verses $V_{gate}$ characteristics of curve 92.

Now, refer back to FIG. 3 and further assume that the stored information in the analog memory element is to be set. Illumination 18 of a given intensity is radiated onto the photodiode 10, causing a photogenerated current to flow. An enable signal is concurrently applied to line 56 and a read voltage is applied to line 58. The enable signal turns on the transistor 54 and allows the read voltage to be applied to the gate of the adjustable threshold transistor 52, turning it ON. The photogenerated current is thereby applied to the amplifier 16 which outputs a signal on line 24. The output on line 24 is sensed by external circuitry and compared with a predetermined reference value. If the output of the amplifier 16 differs from the predetermined reference value, the read voltage is removed from line 58 and high voltage pulses of the proper polarity are applied to that line (the polarity being based upon whether the output of the amplifier is to be increased or decreased). Those high voltage pulses change the polarization of the ferroelectric layer 66 and thus change the log $I_{sd}$ versus $V_{gate}$ characteristics of the adjustable threshold transistor 52. By applying the proper number and intensity of pulses on the line 58 the desired output on line 24 at a given illumination 18 is achieved with a given read voltage.

Figure 6:
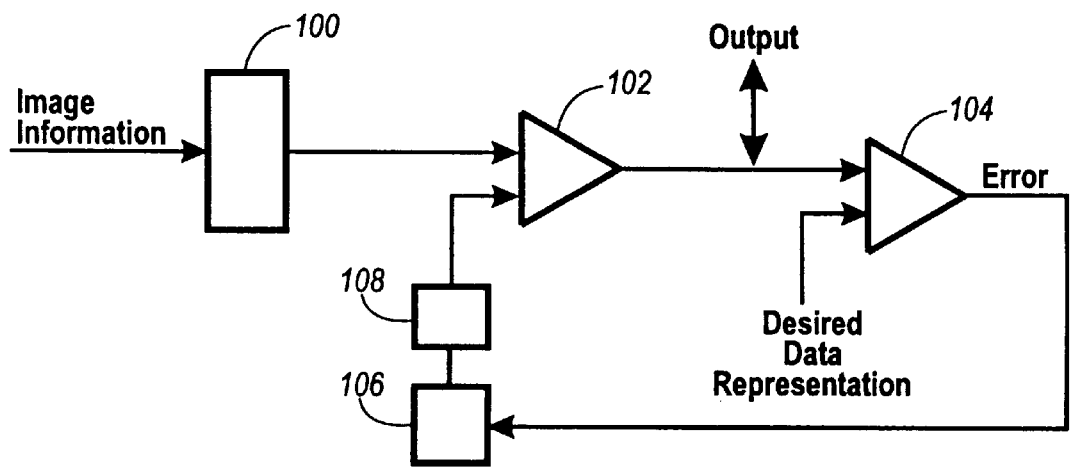
FIG. 6 shows a block diagram useful for understanding the setting of stored information in an analog memory element that is used in an image-to-data transduction process.
Figure 7:
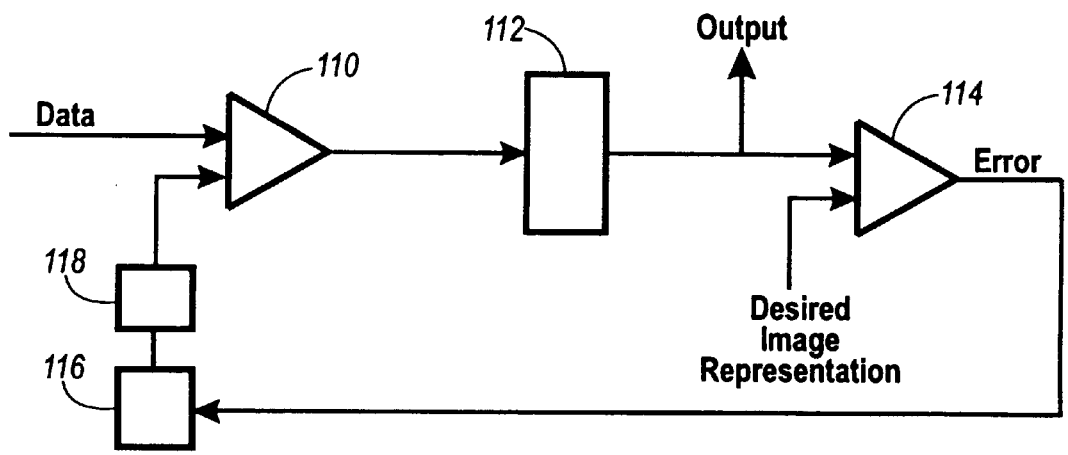
FIG. 7 shows a block diagram useful for understanding the setting of stored information in an analog memory element that is used in a data-to-image transduction process.

The process of setting information in the analog memory element may be better understood with reference to the block diagrams of FIGS. 6 and 7. FIG. 6 shows an image-to-data converter while FIG. 7 shows a data-to-image converter. Referring now to FIG. 6, image information of a known magnitude, say while light from a fixed source reflected off of white paper, is applied to an image transduction element 100. The image transduction element converts the image information into an electronic representation which is applied to a controller 102. The controller creates an output which is applied to a comparator 104 (which need not be part of a cell). Also applied to the comparator is desired information. The comparator creates an error signal which is fed into a memory modification unit 106. The memory modification unit converts the error signal into appropriate quantities (such as pulses of a given magnitude and duration) for application to an analog memory element 108. The analog memory element 108 changes a stored parameter (such a polarization) and, based upon that stored parameter, modifies the transfer function of the controller 102. The error signal changes in response. When the error signal is reduced below some level the correct information is deemed stored in the analog memory element 108. It should be noted that the memory element could modify the transduction element 100 instead and achieve a similar effect.

The setting of stored information in an analog memory element in a data-to-image converter is analogous to the setting of information in an analog memory element in an image-to-data converter. Referring now to FIG. 7, input data, say from a computer, is applied to a controller 110. The controller creates an output which is applied to an image transduction element 112, say a liquid crystal display element, which creates a pixel of image information. That image information is sensed by a comparator 114 (which may include its own transduction element) which also receives desired image information. The comparator creates an error signal which is fed into a memory modification unit 116. The memory modification unit converts the error signal into appropriate quantities (such as pulses of a given magnitude and duration) for application to an analog memory element 118. The analog memory element 118 changes a stored parameter (such a polarization) and, based upon that stored parameter, modifies the transfer function of the controller 110. The electronic representation applied to the image transduction element 112 changes, as does the error signal. When the error signal is reduced below some level the correct information is deemed stored in the analog memory element 118. Again, the memory element could modify the transduction element 100 instead and achieve a similar effect.

After the stored information in the analog memory element has been properly set, the output of the cell 50 in FIG. 3 is calibrated against the predetermined reference value for a given illumination. During calibration, the transistor 54 and line 56 makes it possible to isolate any other pixel cell sharing the line 58. All the elements corresponding to a given gate line 58 can have their memories programmed sequentially by scanning an enable (high) voltage on lines 56 while setting all others to disable (low).

In the illustrated inventive pixel cells the resistance (R) of the adjustable threshold transistor 52 is adjusted such that the charge Q(I) photoinduced on capacitor 12 (having a capacitance C) by the full ON illumination discharges in times that compensate for cell-to-cell variations. To do this the threshold voltage, VT, of the adjustable threshold transistor is modified by inducing charge near the transistor's channel-dielectric interface. This shift in VT results in a change in the "on" resistance, R, of the channel. When Q(I) is discharged from the capacitor 12, the amount of charge actually transferred in the fixed readout time, τ, is $$Q_{out} = Q(I)[1 - \exp(-RC/\tau)].$$

The resistance R is modified, as described above, by pulsing the gate of the adjustable threshold transistor. The time involved to calibrate the device depends on the device itself. For example, if 5 pulses are required on average to calibrate each pixel and there are 1 million pixels in a full 2-d array, then the array could be reset in approximately 10 seconds. If RC=τ, 63% of the charge will be read out. If R is decreased (increased) by a factor of 2, 39% (86%) of the charge would be read out in the same interval.

After calibration, the operation of the array reverts to the sensor mode. Each cell is sampled for a fixed time during which a fixed percentage of the photoinduced charge is readout. One additional step is necessary to implement this feature. Because the charge Q(I) will not be discharged to zero after reading, the standard read pulse can be followed by a higher voltage discharge pulse to dump the remainder of Q from C while the charge is ignored at the output of the amplifier 16.

Another Embodiment Adjustable threshold Transistor 52

Figure 8:
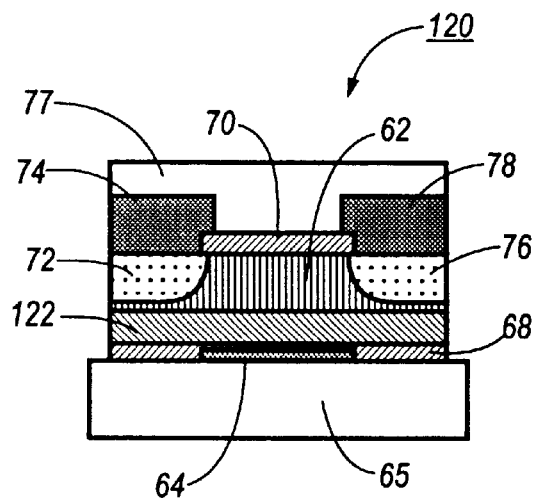
FIG. 8 shows a cross sectional view of another embodiment of an adjustable threshold transistor.

As previously stated, the adjustable threshold transistor 52 has a number of embodiments. Another embodiment (besides the ferroelectric transistor 60 of FIG. 4) is the amorphous silicon transistor 120 shown in FIG. 8. Instead of a ferroelectric layer 66 as in the ferroelectric-gate transistor 60, the transistor 120 has a silicon nitride dielectric layer 122. As indicated, the transistor 120 has a gate electrode 64 on a substrate 65. Over that electrode is an isolation layer 68, beneficially of silicon dioxide. Over that isolation layer is the silicon nitride dielectric layer 122. The nitride layer is beneficially between 50 Å and 200 Å thick. The amorphous silicon active region 62 is then deposited over the silicon nitride layer and then source and drain contacts are fabricated on that active region. Likewise, a dielectric layer 70 is located over the areas of the active region between the source and drain contacts, lead wires (not shown) are patterned, and a passivation layer 77 is placed over the dielectric layer 70 and over the source and drain contacts/leads.

The adjustable threshold transistor 120 has the characteristic that high gate voltage pulses (say between 30–50 volts magnitude and 1–100 msec duration) applied between the gate 64 and the metallic contacts 72 and 76 cause charge injection and charge storage within the silicon nitride dielectric and near the active region/silicon nitride dielectric interface. The sign of the injected charge depends on the polarity of the pulse and the amount depends on the pulse magnitude and duration. The injected charge affects the current flow through the adjustable threshold transistor for a given gate voltage.

An Inventive Second Embodiment Pixel Cell

Figure 9:
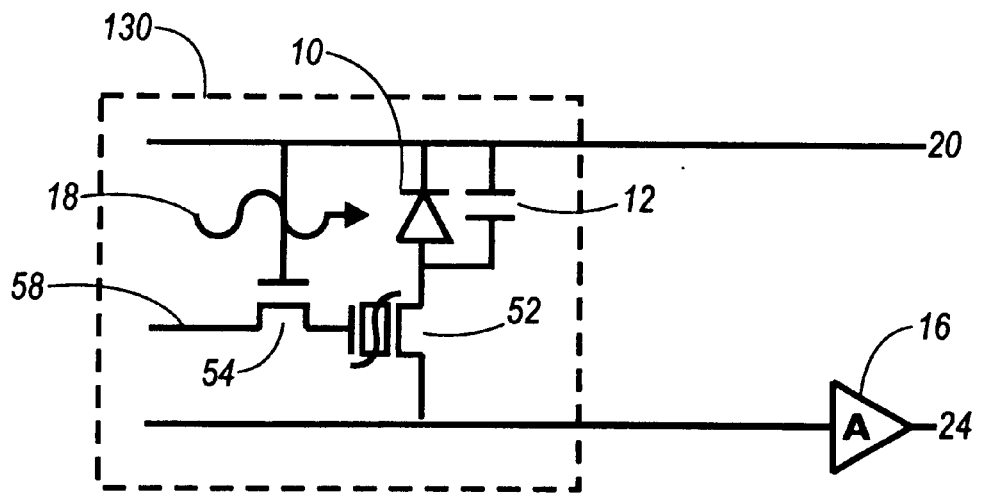
FIG. 9 schematically illustrates a second embodiment pixel cell according to the present invention, wherein a gate line of the first embodiment is connected directly to a voltage line.

Referring again to FIG. 3, the cell 50 includes a line 56. That line must have an applied voltage before the charge on the capacitor 12 can be applied to the amplifier 16. Thus the cell 50 requires inputs on three lines, the lines 20, 56, and 58. In a device which uses hundreds of thousands of individual pixel cells, and particularly for two dimensional arrays of such cells, interconnecting three lines per cell can be difficult. However, FIG. 9 shows an alternative cell 130 which requires only two inputs, those being on lines 20 and 58. As is apparent from an examination of FIGS. 3 and 9, the difference between the cell 50 and the cell 130 is that in the cell 130, the line 56 of cell 50 is connected directly to line 20. When used in an array the voltages on lines 20 can be varied independently from other equivalent lines 20.

To calibrate the cell 130, illumination 18 is radiated onto the photodiode 10 and an operation voltage is applied to line 20. This operation voltage not only biases the photodiode 10, it also enables the transistor 54 so that a gate select voltage applied to line 58 is passed to the adjustable threshold transistor 52. When the gate select voltage is applied on line 58 the adjustable threshold transistor turns on and passes the charge stored on the capacitor 12 to the amplifier 16. The output of the amplifier is then sensed by external circuity and compared with a predetermined reference value. If the output of the amplifier is not the predetermined reference value, high voltage pulses of the proper polarity are applied to the line 58 (the polarity based upon whether the output of the amplifier is to be increased or decreased) so as to adjust the threshold of the adjustable threshold transistor 52. The process of comparing the output of the amplifier with a predetermined value continues until the desired output is achieved when the gate turn on voltage is applied on line 58.

An Array Inventive Pixel Cells

Figure 10:
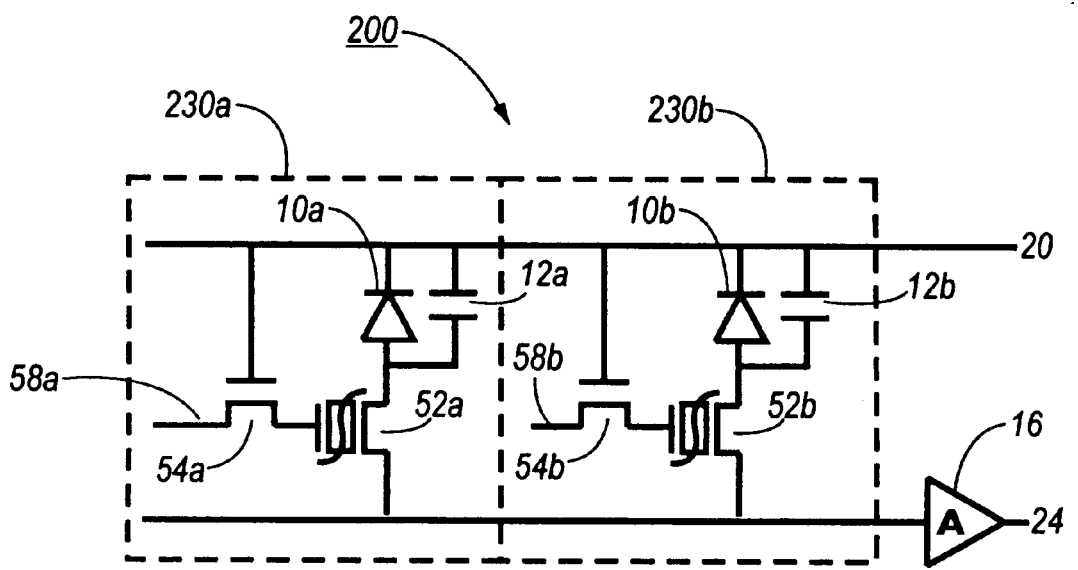
FIG. 10 schematically illustrates a two pixel cell array which uses pixel cells according to FIG. 9.

As alluded to above, pixel cells according to the present invention can be organized into arrays of, say, rows and columns. For example, FIG. 10 shows an array 200 comprised of two pixel cells 230*a* and 230*b* which are assumed to be in different columns of an array. For convenience the components of each cell are designated with labels a and b. Note that the cells share one amplifier 16 which is assumed to connect to all cells in a row.

In order to generate an output from amplifier 16, an operating voltage is applied to line 20. Then, to select which of the two cells will cause a signal to be output, a read voltage is applied to either line 58*a*, to read the photoinduced current from photodiode 10*a*, or to line 58*b*, to read the photoinduced current from photodiode 10*b*.

It is to be understood that while the figures and the above descriptions illustrate the present invention, they are exemplary only. Others who are skilled in the applicable arts will recognize numerous modifications and adaptations of the illustrated embodiment which will remain within the principles of the present invention. Therefore, the present invention is to be limited only by the appended claims.

What is claimed:

1. An array of pixel cells, wherein a pixel of said array of pixel cells is comprised of:
    an image transduction element for converting between an image information representation of a signal associated with said pixel and an electronic representation of said signal;
    an in-pixel analog memory element having a post-fabrication independently adjustable threshold, and further having stored therein analog control information; and
    a controller for converting between said electronic representation and a data information representation of said signal based on said analog control information received from said in-pixel analog memory; said controller being operatively connected to said image transduction element, to said analog memory element, and to a data information line for transferring said data information representation.

2. The array of pixel cells according to claim 1, wherein said controller includes a deposited semiconducting layer.

3. The array of pixel cells according to claim 1, wherein the image transduction element is a sensor.

4. The array of pixel cells according to claim 3, wherein said sensor is a photodiode.

5. The array of pixel cells according to claim 4, wherein said photodiode is for creating photogenerated charge.

6. The array of pixel cells according to claim 1, wherein the image transduction element is a display element.

7. The array of pixel cells according to claim 6, wherein said display element is a liquid crystal display element.

8. The array of pixel cells according to claim 1, wherein said analog control information stored in said analog memory element is used to alter a transfer function associated with said controller to produce a desired relation between said image information and said data information.

9. The array of pixel cells according to claim 1, wherein said analog memory element includes a ferroelectric layer, the remanant polarization of which alters the electrical characteristics of said pixel cell.

10. The array of pixel cells according to claim 9, wherein said controller further includes a field effect transistor comprised of a gate electrode and an active region and wherein said ferroelectric layer is disposed between said gate electrode and said active region.

11. The array of pixel cells according to claim 10, wherein a dielectric layer is disposed between said ferroelectric layer and said active region.

12. The array of pixel cells according to claim 11, wherein said dielectric layer is silicon nitride.

13. The array of pixel cells according to claim 9, wherein said ferroelectric layer is PZT.

14. The array of pixel cells according to claim 1, wherein said analog memory element includes a dielectric layer capable of storing injected charge and wherein said dielectric layer alters the electrical characteristics of said pixel cell.

15. The array of pixel cells according to claim 14, wherein the pixel cell further includes a field effect transistor comprised of a gate electrode and an active region and wherein said dielectric layer is disposed between said gate electrode and said active region.

16. The array of pixel cells according to claim 1, wherein said analog memory element is nonvolatile.

17. An array of pixel cells, wherein a pixel of said array of pixel cells is comprised of:
    an image transduction element for converting between an image information representation of a signal associated with said pixel and an electronic representation of said signal;
    an in-pixel analog memory element for storing therein analog control information comprising a field effect transistor: said field effect transistor comprising a gate electrode, an active region and a ferroelectric layer disposed between said gate electrode and said active region;
    a controller for converting between said electronic representation and a data information representation of said signal based on said analog control information received from said in-pixel analog memory; said controller being operatively connected to said image transduction element, to said analog memory element, and to a data information line for transferring said data information representation; and
    wherein said image transduction element is a photodiode and said controller further comprises a memory select transistor for multiplexing programming pulses on a gate select line connected to said analog memory element, said memory select transistor having a gate connected to a bias line supplying voltage to said photodiode.

18. An array of pixel cells, wherein a pixel of said array of pixel cells is comprised of:
    an image transduction element for converting between an image information representation of a signal associated with said pixel and an electronic representation of said signal;

a data information line for the transfer of data information;

a controller operatively connected to said image transduction element, and to said data information line, said controller for converting between said electronic representation and data information; and an in-pixel analog memory element having a post-fabrication independently adjustable threshold, and further having stored therein analog control information;

wherein said analog memory element is operatively connected to said image transduction element so that said conversion between said image information representation of said signal and said electronic representation of said signal is based upon said analog control information received from said in-pixel analog memory element.

* * * * *